(12) United States Patent
Ayranci et al.

(10) Patent No.: US 10,951,252 B2
(45) Date of Patent: Mar. 16, 2021

(54) 5G NR CONFIGURABLE WIDEBAND RF FRONT-END LNA

(71) Applicant: pSemi Corporation, San Diego, CA (US)

(72) Inventors: Emre Ayranci, Costa Mesa, CA (US); Miles Sanner, San Diego, CA (US); Phanindra Yerramilli, San Diego, CA (US)

(73) Assignee: pSemi Corporation, San Diego, CA (US)

(*) Notice: Subject to any disclaimer, the term of this patent is extended or adjusted under 35 U.S.C. 154(b) by 0 days.

(21) Appl. No.: 16/242,870

(22) Filed: Jan. 8, 2019

(65) Prior Publication Data

US 2020/0220567 A1 Jul. 9, 2020

(51) Int. Cl.
*H04B 1/06* (2006.01)
*H03F 3/195* (2006.01)
*H04B 1/18* (2006.01)
*H03F 1/26* (2006.01)
(Continued)

(52) U.S. Cl.
CPC .......... *H04B 1/18* (2013.01); *H03F 1/26* (2013.01); *H03F 3/195* (2013.01); *H04B 1/0057* (2013.01); *H04B 1/0458* (2013.01); *H03F 2200/294* (2013.01); *H03F 2200/451* (2013.01)

(58) Field of Classification Search
CPC ........ H03F 1/0205; H03F 1/303; H03F 3/189; H03F 3/193; H03F 3/195; H03F 3/347; H03F 2200/222; H03F 2200/387; H03F 2200/411; H03F 2200/451; H04B 1/006;
(Continued)

(56) References Cited

U.S. PATENT DOCUMENTS 7,612,616 B2 * 11/2009 Deng .................... H03F 1/0205
330/253
8,018,288 B2 * 9/2011 Duster .................. H03F 1/0255
330/253
(Continued)

FOREIGN PATENT DOCUMENTS

CN 108336976 7/2018
EP 2959578 12/2015
(Continued)

OTHER PUBLICATIONS

Ayranci, et al., "Configurable Wideband Split LNA", patent application filed in the USPTO on Jan. 8, 2019, U.S. Appl. No. 16/242,883, 62 pgs.
(Continued)

*Primary Examiner* — Quochien B Vuong
(74) *Attorney, Agent, or Firm* — Jaquez Land Greenhaus LLP; Alessandro Steinfl, Esq.

(57) ABSTRACT

Methods and devices addressing design of reconfigurable wideband LNAs to meet stringent gain, noise figure, and linearity requirements with multiple gain modes are disclosed. The disclosed teachings can be used to reconfigure RF receiver front-end to operate in various applications imposing stringent and conflicting requirements, such as 5G NR radios. Wideband and narrowband input and output matching with gain modes using a combination of the same hardware and a switching network are also disclosed.

27 Claims, 18 Drawing Sheets

(51) Int. Cl.
*H04B 1/04* (2006.01)
*H04B 1/00* (2006.01)

(58) Field of Classification Search
CPC ............ H04B 1/16; H04B 1/40; H04B 1/406; H04W 84/12
See application file for complete search history.

(56) References Cited

U.S. PATENT DOCUMENTS

| | | | |
|---|---|---|---|
| 8,073,400 B2 * | 12/2011 | Gorbachov | H04B 1/406 455/553.1 |
| 9,059,665 B2 * | 6/2015 | Youssef | H03F 3/245 |
| 9,479,126 B2 * | 10/2016 | Ilkov | H03F 1/565 |
| 9,748,985 B2 * | 8/2017 | Zhang | H03F 3/24 |
| 9,887,720 B2 * | 2/2018 | Lin | H04B 1/18 |
| 9,941,849 B1 | 4/2018 | Ayranci et al. | |
| 9,973,149 B2 | 5/2018 | Ayranci et al. | |
| 10,348,262 B2 | 7/2019 | Lee et al. | |
| 10,700,650 B1 | 6/2020 | Ayranci et al. | |
| 2018/0062600 A1 | 3/2018 | Lee et al. | |
| 2018/0175797 A1 | 6/2018 | Lee et al. | |
| 2019/0207639 A1 | 7/2019 | Hageraats et al. | |
| 2020/0220508 A1 | 7/2020 | Ayranci et al. | |

FOREIGN PATENT DOCUMENTS

| | | |
|---|---|---|
| EP | 2974003 | 1/2016 |
| WO | 2018013206 | 1/2018 |
| WO | 2020146504 | 7/2020 |

OTHER PUBLICATIONS

Choe, Henry, Notice of Allowance received from the USPTO dated Mar. 10, 2020 for U.S. Appl. No. 16/242,883, 16 pgs.

Zanglein, Ulrike, International Search Report and Written Opinion received from the EPO dated Apr. 3, 2020 for appln. No. PCT/US2020/012745, 40 pgs.

Choe, Henry, Corrected Notice of Allowance received from the USPTO dated Apr. 22, 2020 for U.S. Appl. No. 16/242,883, 3 pgs.

* cited by examiner

Fig. 1 (Prior Art)

| Wideband mode | Gain Flatness | Linearity | Area | Current | Max Gain |
|---|---|---|---|---|---|
| Architecture of Fig. 2A | Worse | Typical | Best | Typical | Worse |
| Architecture of Fig. 2B | Best | Best | Typical | Worse | Best |
| Architecture of Fig. 2C | Typical | Worse | Worse | Typical | Typical |

Fig. 2D

|  | S1 | S2 | S3 | S4 | S5 | S6 | S7 | S8 | S9 | S10 | S11 | S12 |
|---|---|---|---|---|---|---|---|---|---|---|---|---|
|  | a-a' | b-b'/b-b'' | c-c' | d-d' | e-e' | f-f' | g-g' | h-h' | i-i' | j-j' | k-k' | l-l' |
| switch state | closed | b-b' | closed | open | open | open | open | open | closed | open | closed | open |

| switch state | S1 a-a' | S2 b-b'/b-b'' | S3 c-c' | S4 d-d' | S5 e-e' | S6 f-f' | S7 g-g' | S8 h-h' | S9 i-i' | S10 j-j' | S11 k-k' | S12 l-l' |
|---|---|---|---|---|---|---|---|---|---|---|---|---|
| | closed | b-b'' | open | open | closed | open | closed | closed | open | closed | open | open |

| switch state | S1 | S2 | S3 | S4 | S5 | S6 | S7 | S8 | S9 | S10 | S11 | S12 |
|---|---|---|---|---|---|---|---|---|---|---|---|---|
| | a-a' | b-b'/b-b'' | c-c' | d-d' | e-e' | f-f' | g-g' | h-h' | i-i' | j-j' | k-k' | l-l' |
| | open | b-b'' | open | open | open | closed | open | open | open | closed | open | open |

| | S1 | S2 | S3 | S4 | S5 | S6 | S7 | S8 | S9 | S10 | S11 | S12 |
|---|---|---|---|---|---|---|---|---|---|---|---|---|
| | a-a' | b-b'/b-b'' | c-c' | d-d' | e-e' | f-f' | g-g' | h-h' | i-i' | j-j' | k-k' | l-l' |
| switch state | closed | b-b'' | closed | open | closed | closed | open | open | open | closed | open | open |

Fig. 8B

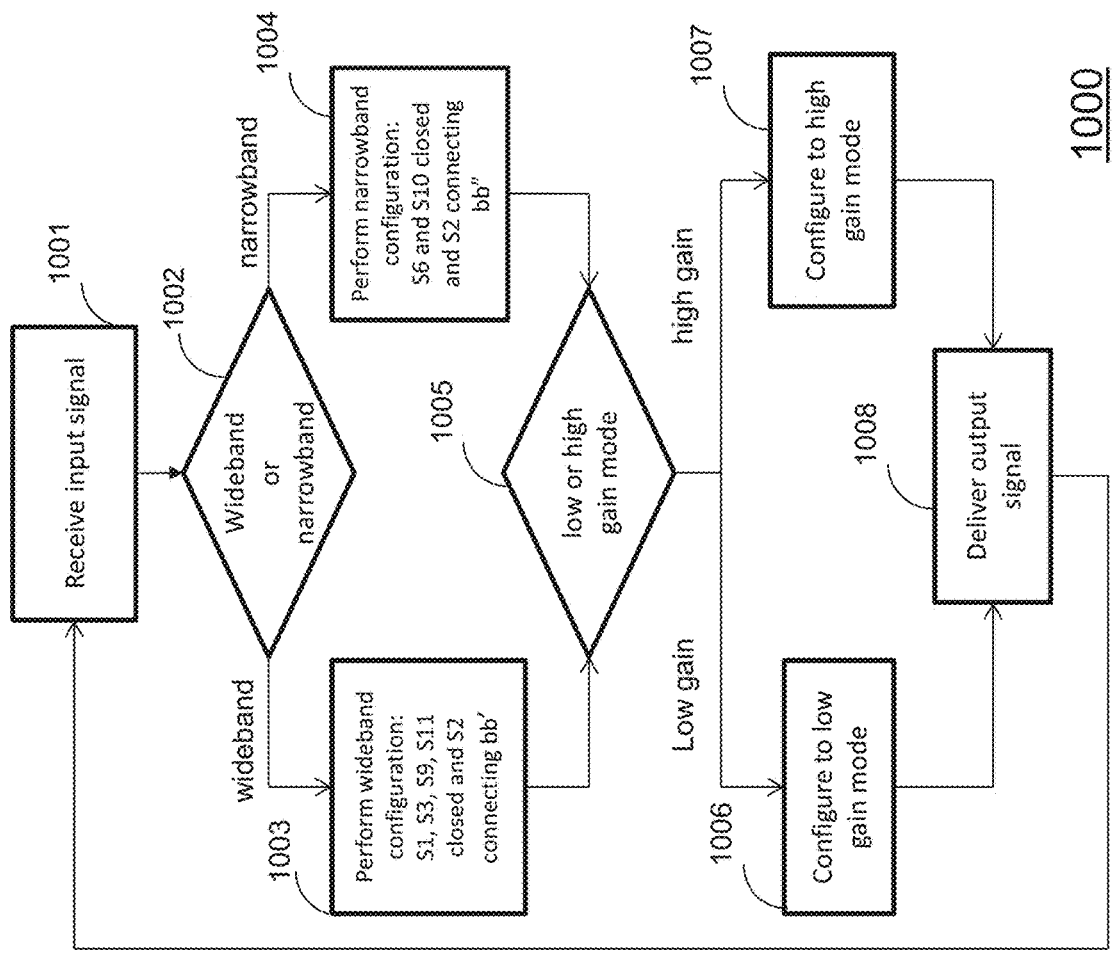

5G NR CONFIGURABLE WIDEBAND RF FRONT-END LNA

CROSS-REFERENCE TO RELATED APPLICATIONS

The present application is related to U.S. application Ser. No. 15/342,016 filed Nov. 2, 2016, entitled "Source Switched Split LNA" (now U.S. Pat. No. 9,973,149 issued May 15, 2018) incorporated herein by reference in its entirety. The present application is also related to U.S. application Ser. No. 15/430,332 filed Feb. 10, 2017, entitled "Programmable Optimized Band Switching LNA for Operation in Multiple Narrow-Band Frequency Ranges" (now U.S. Pat. No. 9,941,849 issued Apr. 10, 2018) incorporated herein by reference in its entirety. The present application may be further related to U.S. application Ser. No. 16/242,883 entitled "Configurable Wideband Split LNA" and filed on Jan. 8, 2019, which is incorporated by reference in its entirety.

BACKGROUND

(1) Technical Field

The present disclosure is related to low noise amplifiers (LNAs), and more particularly to methods and apparatus for designing wideband LNAs with gain modes.

(2) Background

The exponential growth of mobile data and emergence of new standards presents significant challenges to radio frequency (RF) receiver front-end design and architecture. By way of illustration, FIG. 1 shows some examples of frequency band specifications including ultra high bands (UHB) as defined by the 5G new radio (NR) standard. Such bands cover a wide range of frequencies. More in particular, reference may be made to band n77 as shown in FIG. 1, covering a frequency range of 900 MHz from 3.3 to 4.2 GHz. For comparison purpose, the relatively wide 4G long-term evolution (LTE) band B41 covers from 2.5 GHz to 2.69 GHz and the existing UHB LTE bands B42 and B43 cover around 200 MHz. Based on newer wireless communication standards' ever increasing data rates, the RF receiver front-end design is facing the challenge of meeting conflicting and demanding requirements imposed on performance metrics such as gain, gain flatness, linearity, noise figure (NF) and receiver sensitivity, power consumption etc. In addition to meeting the mentioned requirements, such designs are expected to be cost effective with smaller footprints. Added to this challenge is backward compatibility. In other words, and as an example, systems designed to accommodate wideband, will still need to be compatible with older narrow band requirements such as out-of-band gain characteristics.

An additional challenge is the ability to handle the variable signal strength received at wireless RF receiver front-ends, which typically have a wide dynamic range. This is because the signal strength depends on how far or close the receiver is from the nearest base station. In order to accommodate such large dynamic ranges, LNAs are typically designed with adjustable gains or multiple gain modes.

Historically, in order to meet the conflicting and stringent requirements as described above, circuits and systems have been designed with several switches, filters and LNAs. In such circuits, separate sets of LNAs, switches and filters would be dedicated, for example, to different subsets of the frequency bands to be supported. While such an approach may be workable, it comes with the significant drawbacks such as area, component count and cost-effectiveness. For example, a design using several LNAs requires significant allocation of area on the integrated circuit (IC) on which the LNAs are fabricated. The cost of the IC is proportional to the size of the IC (i.e., the amount of "real estate" required). Therefore, relying on several narrowband LNAs significantly increases the overall size and cost of the IC.

DESCRIPTION OF CONCEPTS AND TERMINOLOGIES USED THROUGHOUT THE DISCLOSURE

In what follows, some of the concepts later adopted by the methods and devices presented in the disclosure are defined and described. Some relevant performance tradeoffs highlighting implications of designing for stringent/conflicting requirements when designing RF receiver front-ends are also discussed. Exemplary prior art architectures are also described to further illustrate the shortcomings of existing solutions to the challenges encountered when designing for high performance wideband RF receiver front-ends.

Throughout the present disclosure, the term "source follower" will be used to describe one of the basic single-stage field effect transistor (FET) amplifier topologies, typically used as a voltage buffer. In this circuit, the gate terminal of the transistor serves as the input, the source is the output, and the drain is common to both (input and output). In such a circuit, the output impedance as seen from the source of the FET, is approximately equal to $$\frac{1}{g_m}$$

where $g_m$ represents the transconductance of the FET device. The source follower configuration is known essentially to be an impedance transformer, providing improved and substantially frequency independent output matching. This is a primary reason why the source follower is a suitable architecture to be used for wideband applications.

As known in the art, in RF systems bandwidth is sometimes defined in terms of percentage bandwidth, which is defined as the ratio (in percentage) of the absolute bandwidth to the center frequency at which such RF systems operate. One performance metric of RF amplifiers associated with the bandwidth is represented by gain flatness over the specified bandwidth. Gain flatness is typically specified in dB, indicating the gain variation over the frequency range of operation. Throughout the disclosure the terms:

"Narrowband" will be used to describe applications where the frequency range of operation represents a percentage bandwidth of less than 7.5%. An example for such a case is band 42 of the Long-Term Evolution (LTE) standard that has a frequency range of 3,400-3,600 MHz and a 5.7% bandwidth;

"Extended Narrowband" will be used to describe applications where the frequency range of operation represents a percentage bandwidth between 7.5% and 15%. An example for such a case is the band NR79 of the 5G new radio (NR) standard; and "Wideband" will be used to describe applications where the frequency range of operation represents a percentage bandwidth between 15% and 25%. An example for such a case is the band NR77 of the 5G new radio (NR) standard.

In view of the design challenges described in the previous section, input and output matching (represented by the $S_{11}$ and $S_{22}$ parameters) and gain flatness across the bandwidth are among the key performance metrics while maintaining lowest NF, high gain and high linearity. Additionally, lower gain modes requiring higher linearity are also highly desired. Lower power consumption may be achieved when operating in lower gain modes.

Throughout the present disclosure, the term "de-Qing" will be used to describe design techniques where the quality factor (Q) of a circuit is lowered to improve some other performance metrics. As an example, in a typical LNA architecture, de-Qing of the load may be exercised to achieve a desired gain flatness over a wider frequency band at the expense of reducing the gain. De-Qing an LC network is typically performed by increasing the series resistance or decreasing the parallel resistance of such a network resulting in a lower gain. The same concept could be applied to the input of a typical LNA architecture whereby a wider input match can be achieved by reducing the quality factor of the input matching network, at the expense of NF and gain.

For wideband applications, various approaches may be adopted to design for wider output matching:
  De-Qing: as described above, such a technique resulting in lower gain;
  Designing multi-stage passive output match which would offer higher bandwidth. However, this approach will require high Q inductors; and
  A source follower topology, which may be used without sacrificing gain while achieving an improved linearity. However, this may not be an ideal solution on its own, when a lower gain and therefore a lower power consumption is required.

As for the receiver front-end input, a wider input match is typically achieved using a resistive negative feedback network, which may offer better tradeoffs among NF, gain and S11 bandwidth. In what follows, and in order to further clarify the various above-mentioned techniques and associated tradeoffs, typical prior art LNA architectures are described.

FIG. 2A shows a prior art receiver front-end (200A). The receiver front-end (200A) comprises amplifying cascode transistors (T1, T2), an input match circuit (201) and output match network (202). The input match network (201) comprises an input inductor (L1) and a degenerative inductance (L2) (the input transistor, T1, is shown in input match (201) for graphical convenience, but is typically not considered part of the input match circuit). The output match network (202) comprises inductor (Ld), resistor (Rd) and capacitor ($C_{match}$). As described before, resistor (Rd) is used for de-Qing the output match network (202) to address wideband requirements However, this will result in a lower gain impacting the overall system performance of the receiver implementing such front-end architecture. At the input, de-Qing may be performed by resizing transistor (T1) which may adjust NF and gain.

FIG. 2B shows a prior art receiver front-end (200B) which has a better performance in wideband applications compared to the receiver front-end (200A) of FIG. 2A. The receiver front-end (200B) comprises a feedback resistor (Rf) switched in by closing switch (S1), and used to increase the bandwidth. Output matching is now achieved using a source follower circuit (201) including transistor (T3) and inductor ($L_{SF}$). As described previously, the output impedance of the source follower is equal to $$\frac{1}{g_m}$$

where $g_m$ represents the transconductance of transistor (T3). Such transconductance is practically frequency independent offering improved output matching for wideband applications.

FIG. 2C also shows a prior art receiver front-end (200C) using multi-stage output matching to meet extended narrowband requirements (as defined above). The receiver front-end (200C) comprises a multi-stage output matching network (203) having multiple reactive elements ($L_1$, $L_2$, $L_d$, $L_4$, $C_1$, $C_2$, $C_3$). The output matching network (203) is essentially a higher order filter with multiple poles providing more flexibility to design for wider bands. However, this architecture has the drawback of being bulky and requires a larger area to be implemented.

FIG. 2D shows a comparison table (200D) summarizing qualitatively the overall performances of the architectures shown in FIGS. 2A-2C when used in wideband applications. Gain flatness, area, linearity and power consumption requirements in a typical wideband application are shown for comparison purpose, together with the performance of each architecture, as assessed based on such requirements.

With reference to FIGS. 2A-2C, none of the architectures shown offer multiple gain modes. Each architecture uses specific approaches to address specific requirements by trading off other system performance metrics.

In view of the above, cost-effective RF receiver front-end designs using a minimum number of electronic elements and thus offering small footprint, while meeting the above-mentioned stringent and conflicting requirements related to performance metrics such as gain, gain flatness, gain modes, NF, linearity, multiple frequency bands, wide receiver dynamic range and power consumption are highly desired. Methods and devices described in the present disclosure address such needs and provide solutions to the technical problems outlined above.

SUMMARY

According to a first aspect of the present disclosure, a Radio Frequency (RF) receiver front-end is provided, comprising: a reconfigurable low noise amplifier (LNA) block having an input matching network, and an LNA block output; an output matching network; and a switching network; wherein: the RF receiver front-end is connectable to a load; the switching network is connected to the input matching network, the LNA block and the output matching network; the RF receiver front-end is configured to receive an input signal at an RF receiver front-end input and deliver a corresponding output signal at an RF receiver front-end output connected to the load; and the switching network is configured to configure or reconfigure the RF receiver front-end such that performance metrics of the RF receiver front-end meet one or more requirements.

According to a second aspect of the present disclosure, a method of amplifying an input signal received at an RF receiver front-end is disclosed, comprising: providing an input matching network; providing an LNA block with an input matching network and an LNA block output; providing an output matching network; configuring the input matching network, the LNA block and the output matching network such that the RF receiver front-end meets one or more requirements Further aspects of the disclosure are provided in the description, drawings and claims of the present application.

DESCRIPTION OF THE DRAWINGS

Figure 1:
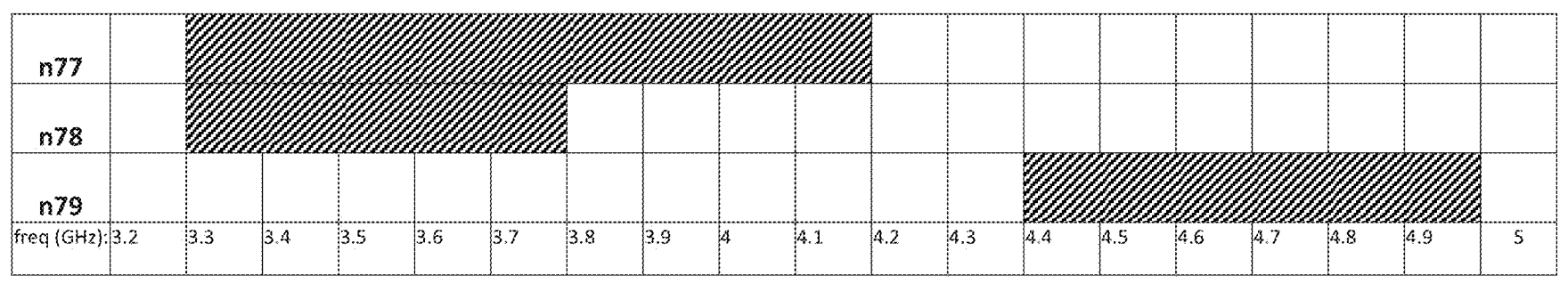

FIG. 1 shows some examples of frequency band specifications as defined by the 5G new radio (NR) standard.

FIG. 2D shows a comparison table summarizing the overall performances of the architectures shown in FIGS. 2A-2C when used in wideband applications.

FIGS. 5B, 6B, 7B and 8B shows tables representing switch states according to embodiments of the present disclosure.

FIG. 10 shows a high level flowchart representing the reconfigurability of RF receiver front-ends designed according to the teachings of the present disclosure.

DETAILED DESCRIPTION

Throughout the present disclosure, the term "node" will be used to describe any point on a circuit where connections of two or more circuit elements meet or are adapted to meet. Although nodes will be graphically represented by points in the present disclosure, the person skilled in the art will understand that a node may also present part of a line or connection between elements or circuital devices, not just a single point.

Figure 3:
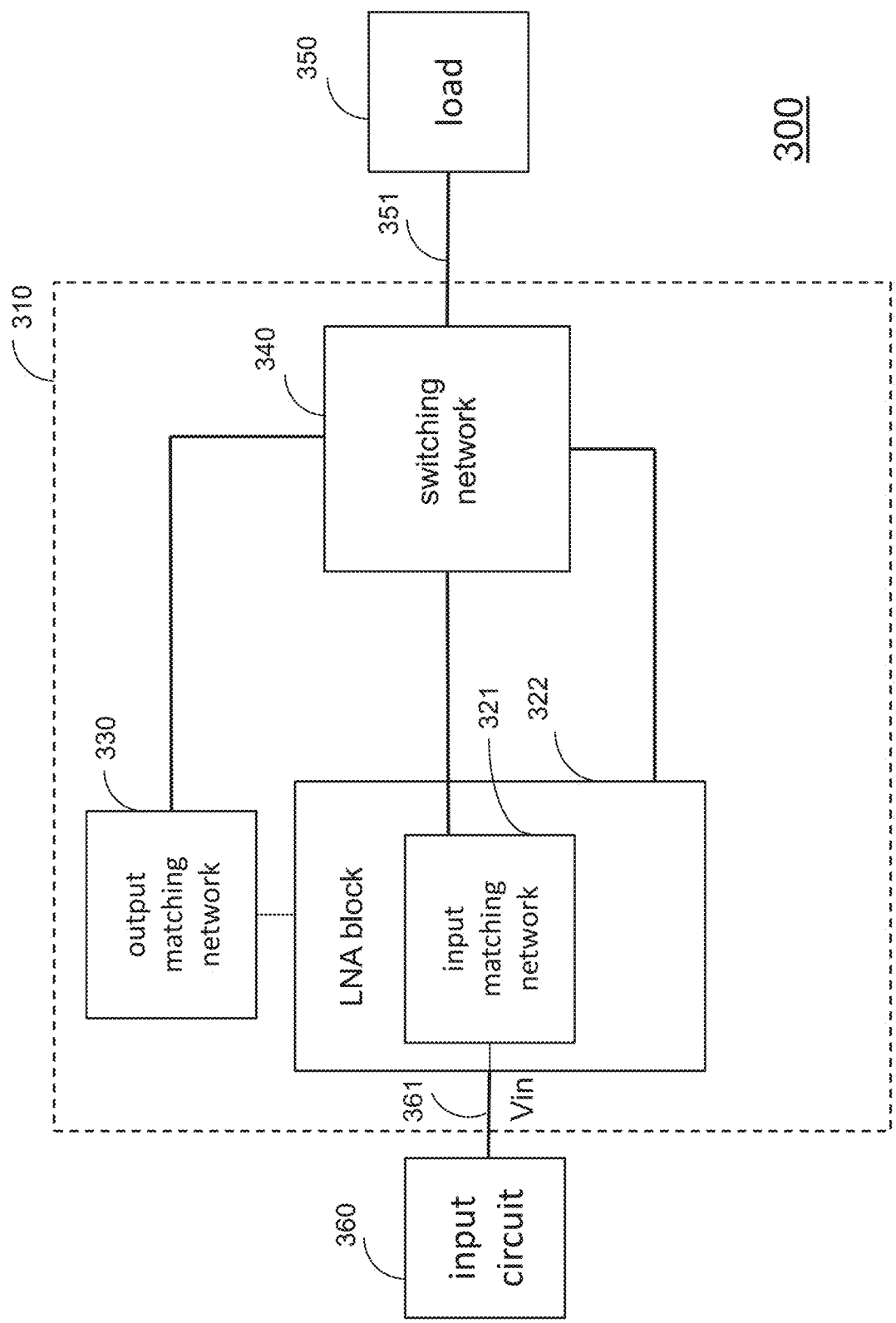
FIG. 3 shows an electronic circuit according to an embodiment of the present disclosure.

FIG. 3 shows an electronic circuit (300) according to an embodiment of the present disclosure. The electronic circuit (300) comprises an RF receiver front-end (310) connectable to an input circuit (360) at the RF receiver front-end input (361) and to a load (350) at the RF receiver front-end output (351). The RF receiver front-end (310) comprises an LNA block (322), an output matching network (330) and a switching network (340). The LNA block (322) comprises an input matching network (321). The switching network (340) is connected to the output matching network (330), the LNA block (322) and the input matching network (321). The RF receiver front-end (310) is configured to receive an input signal (Vin) from the input circuit (360) at the RF receiver front-end input (361) and to generate a corresponding output signal at the RF receiver front-end output (351), that is delivered to the load (350).

With reference to FIG. 3, the switching network (340) comprises one or more switches used to configure/reconfigure the RF receiver front-end (310) to meet different and possibly conflicting requirements imposed by various applications. In other words, by turning a subset of such switches on or off, certain electronic elements that are constituents of the input matching network (321), LNA block (322), and/or output matching network (330) may be switched in and out of a signal path from the RF receiver front-end input (361) to RF receiver front-end output (351), such that the RF receiver front-end (310) is adapted to meet certain design requirements. By way of example, and not of limitation, the RF receiver front-end (310) may be used in a first application where saving power is of highest importance. In such application, the RF receiver front-end (310) may be configured to possibly switch to lower gains more often so that the overall power consumption requirements are met. This is in contrast with a second exemplary application where a signal having the highest possible strength is highly desired. In this scenario, the RF receiver front-end (310) may be configured to accommodate the highest fidelity. In order to do so and compared to the first application, a different set of switches may be turned on or off thereby switching in and out different electronic elements so the requirements imposed by the second application are met. The person skilled in the art will appreciate that the methods and devices designed in accordance with teachings of the present disclosure allow for a higher flexibility to accommodate applications imposing completely different requirements using practically the same design. In what follows, exemplary embodiments of the present disclosure will be described to further clarify such concepts.

Figure 4A:
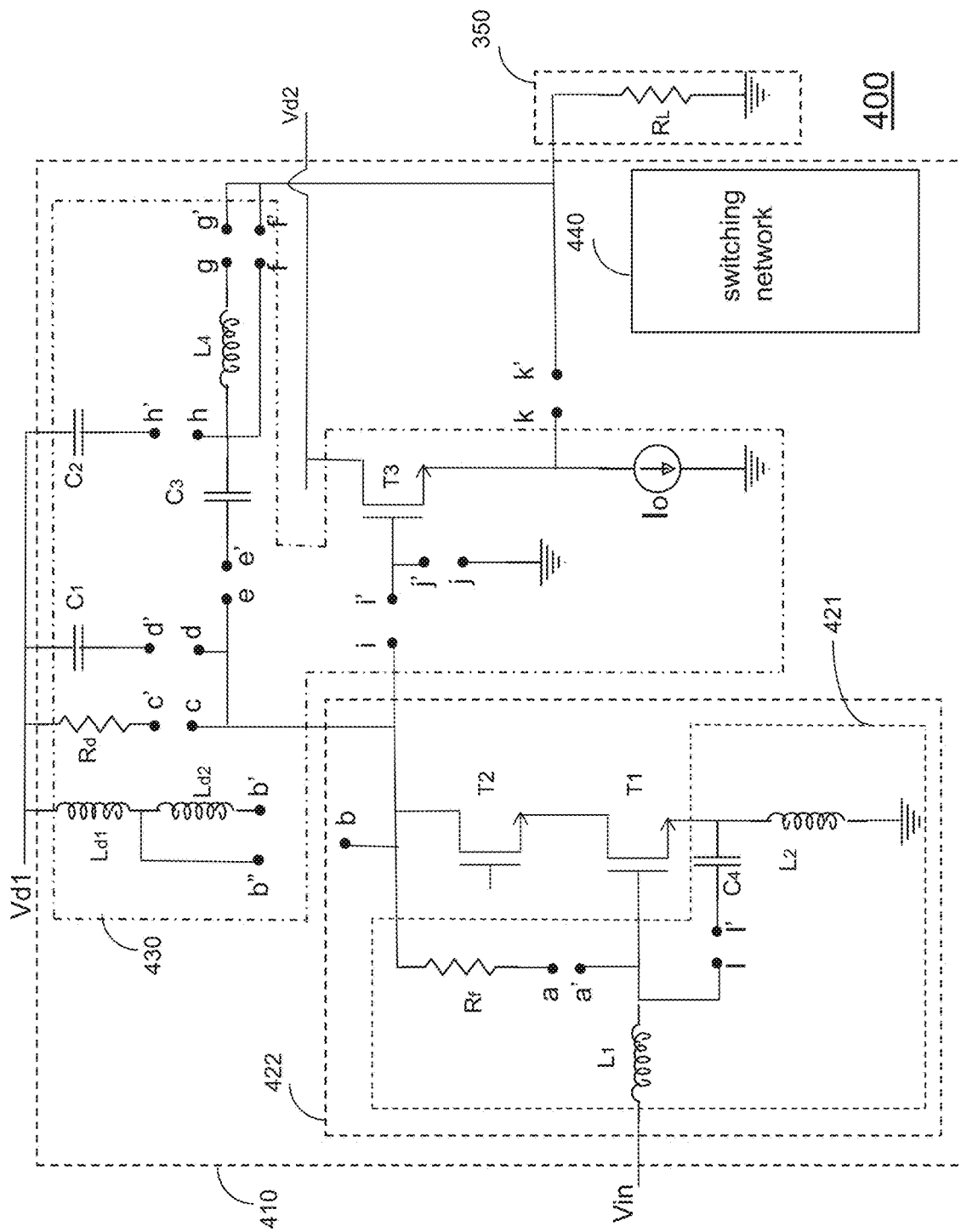
FIG. 4A shows another electronic circuit according to an embodiment of the present disclosure.

FIG. 4A shows an electronic circuit (400A) in accordance with an embodiment of the present disclosure. The electronic circuit (400A) comprises output matching network (430) and an LNA block (422) including an input matching network (421). The RF receiver front-end (410) is an exemplary implementation of the RF receiver front-end (310) of FIG. 3. In other words, input matching network (421), LNA block (422) and output matching network (430) are exemplary implementations of their counterparts, input matching network (321), LNA block (322) and output matching network (330) of FIG. 3, respectively. The RF receiver front-end (410) is connectable to the load (350). Connections of the switching network (440) to the rest of the circuit are not shown for the sake of simplicity. As shown in FIG. 4A, RF receiver front-end (410) comprises several connection points that are represented by nodes (a, a1, b, b', b'', c, c1, . . . , l, l'). Nodes represented with same alphabetic letter in their name correspond to each other. For example, nodes (a, a') may be connected to each other using a switch. As a further example, node (b) may be connected to node (b') or (b'') depending on the position of a corresponding single-pole double-throw switch. As will be explained in what follows, switches used for such purpose may be constituents of the switching network (440). The switching network may be configured differently to serve different applications with various and sometimes conflicting requirements.

With reference to FIG. 4A:

feedback resistor ($R_f$) may be switched in and out by connecting and disconnecting nodes (a, a'), respectively. The feedback resistor ($R_f$) may be switched in to provide a wider band input matching. According to embodiments of the present disclosure, the feedback resistor ($R_f$) may be part of a feedback network comprising resistors and reactive elements such as inductors and/or capacitors.

Depending on the required output matching, a larger or smaller inductor can be used by connecting node (b) to node (b') or node (b'') respectively. In accordance with further embodiments of the present disclosure, any or a combination of inductors ($L_{d1}$, $L_{d2}$) may be replaced by a variable inductor.

Transistor (T3) may be switched in/out by connecting/disconnecting nodes (i, i'), respectively. When transistor (T3) is switched in, a combination of such transistor and current source (Io) provide a source follower configuration. As mentioned previously, such configuration is used when a wider band output matching is desired while minimizing impact on gain and linearity. In narrower band applications where transistor (T3) may not be required, the gate of transistor (T3) is connected to ground by connecting nodes (j, j') to minimize power consumption.

As mentioned previously, for wideband applications, resistor ($R_d$) may be switched in by connecting nodes (c, c'). As a result, wider band output matching is achieved at the expense of the gain.

A combination of capacitors (C1, C2, C3) and inductor (L4) or a subset thereof may be switched in to achieve wideband operation using only passive elements. This represents essentially a multi-stage passive output matching network.

Nodes (l, l') can be connected/disconnected to achieve narrow/wide band input matching. When nodes (l, l') are connected, a combination of capacitance (C3) and gate-source capacitance ($C_{gs}$) of transistor (T3) with inductances (L1, L2) and feedback resistor ($R_f$) forms the input matching network (421). Therefore, switching feedback resistor ($R_f$) and/or capacitor (C4) provides two different mechanisms to provide wider or narrow band input matching depending on desired requirements.

Receiver front-end (410) may be configured to receive voltages ($V_{d1}$, $V_{d2}$) for biasing purposes.

Figure 4B:
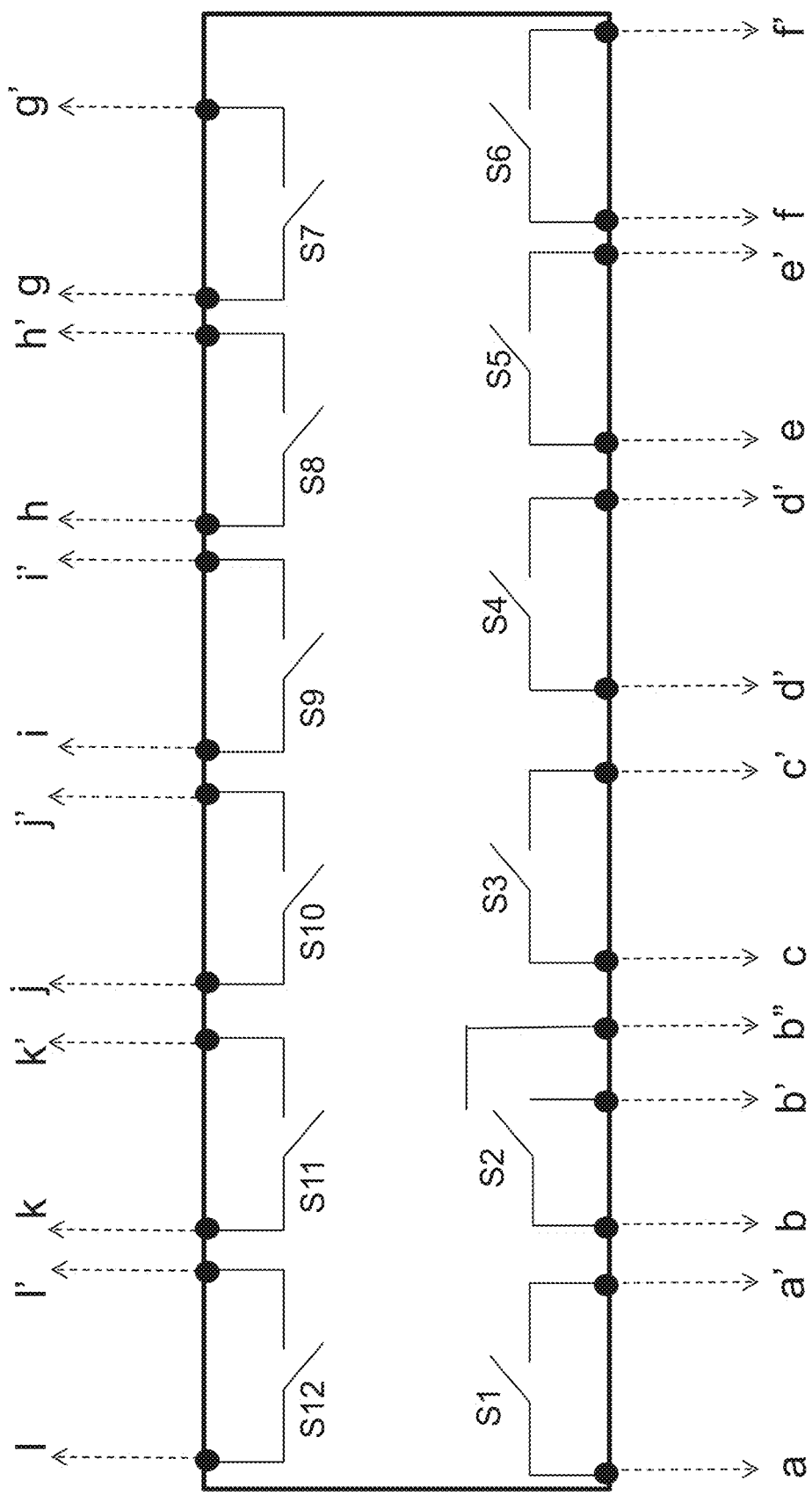
FIG. 4B shows a switching network according to embodiments of the present disclosure.

FIG. 4B shows a switching network (440) in accordance with embodiments of the present disclosure. Switching network (440) represents an exemplary implementation of the switching network of FIGS. 3 (340) and 4A, comprising one or more switches (S1, . . . , S12). Switching network (440) further comprises several nodes shown in black dots connecting to various corresponding nodes of the electronic circuit (400A). Connections of the nodes of the switching network (440) to corresponding nodes of the electronic circuit (400A) are shown with dotted arrows. Referring to FIGS. 4A-4B, and as an example, switch (S1) may selectively connect or disconnect nodes (a, a1), switch (S2) may connect or disconnect nodes (b, b') or (b'b"), switch (S3) may connect or disconnect nodes (c, c') and so on. As mentioned previously, the configuration of switches (S1, . . . , S12) depends on the application and therefore the desired set of requirements that are to be met. According to the embodiment of the present disclosure, the configuration of switches (S1, . . . , S12) may change during operation of the circuit.

Figure 5A:
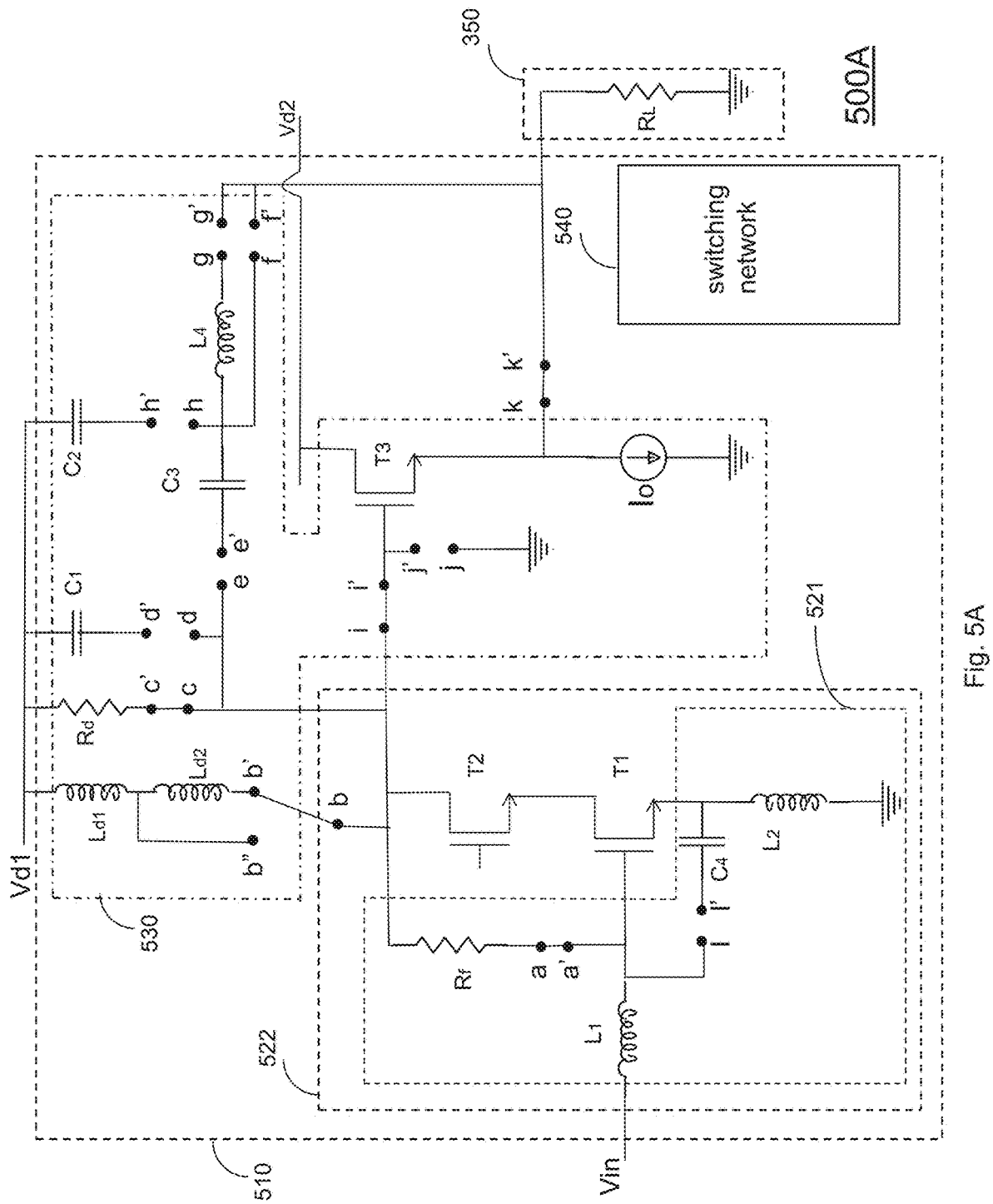
FIGS. 5A, 6A, 7A, 8A and 9 show various electronic circuits in accordance with embodiments of the present disclosure.

In accordance with embodiments of the present disclosure, FIG. 5A shows an electronic circuit (500A) comprising an RF receiver front-end (510) which is the RF receiver front-end (410) of FIG. 4A configured according to what is shown in switching configuration table (500B) of FIG. 5B. As shown in switching configuration table (500B), switches (S1, . . . , S12) of switching network (540) are mentioned in a top row, with a bottom row showing states of the switches and a middle row showing switch node IDs. In other words, input matching network (521), LNA block (522) and output matching network (530) represent their respective counterparts (421, 422, 430) of FIG. 4A, each configured according to table (500B) of FIG. 5B. In view of what described previously throughout the disclosure, the RF receiver front-end (510) is configured to meet wideband requirements using a source follower configuration providing best gain flatness across wideband and using larger inductance (series combination of $L_{d1}$ and $L_{d2}$).

Figure 2A:
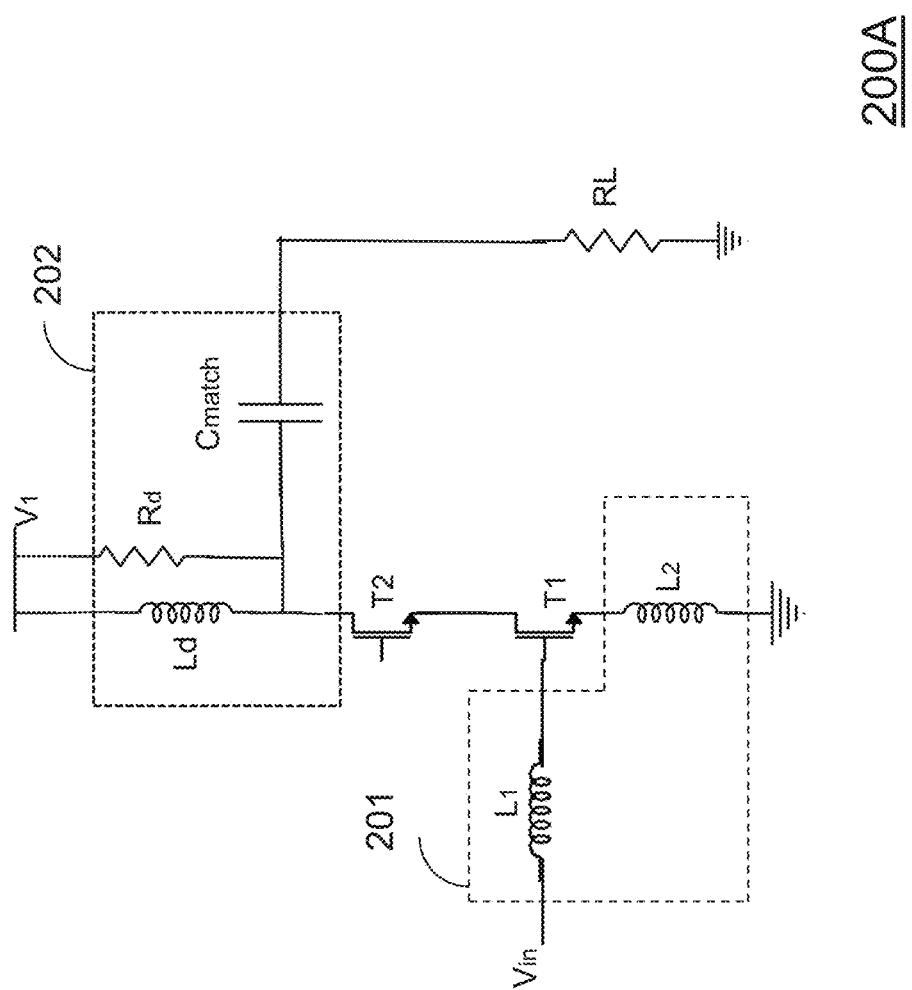
FIG. 2A shows prior art receiver front-end which is more suitable for narrow-band applications.
Figure 2B:
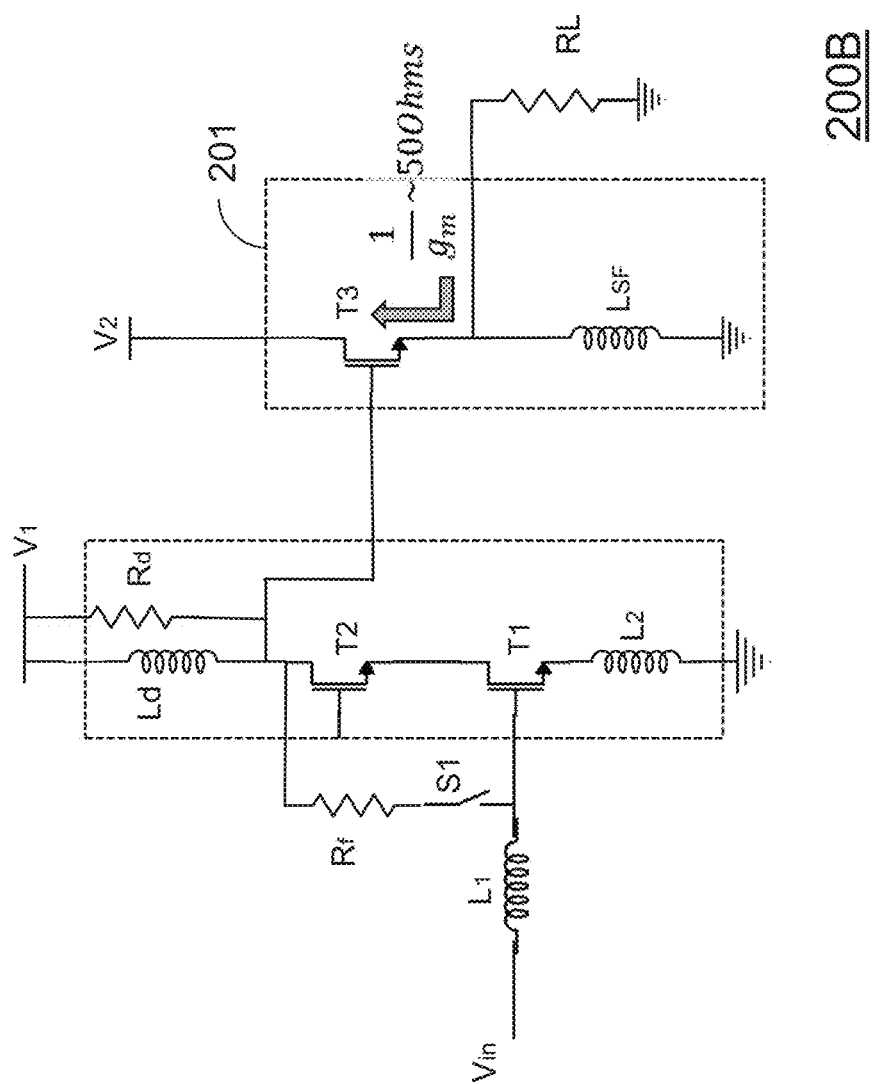
FIG. 2B shows another prior art receiver front-end architecture.
Figure 2C:
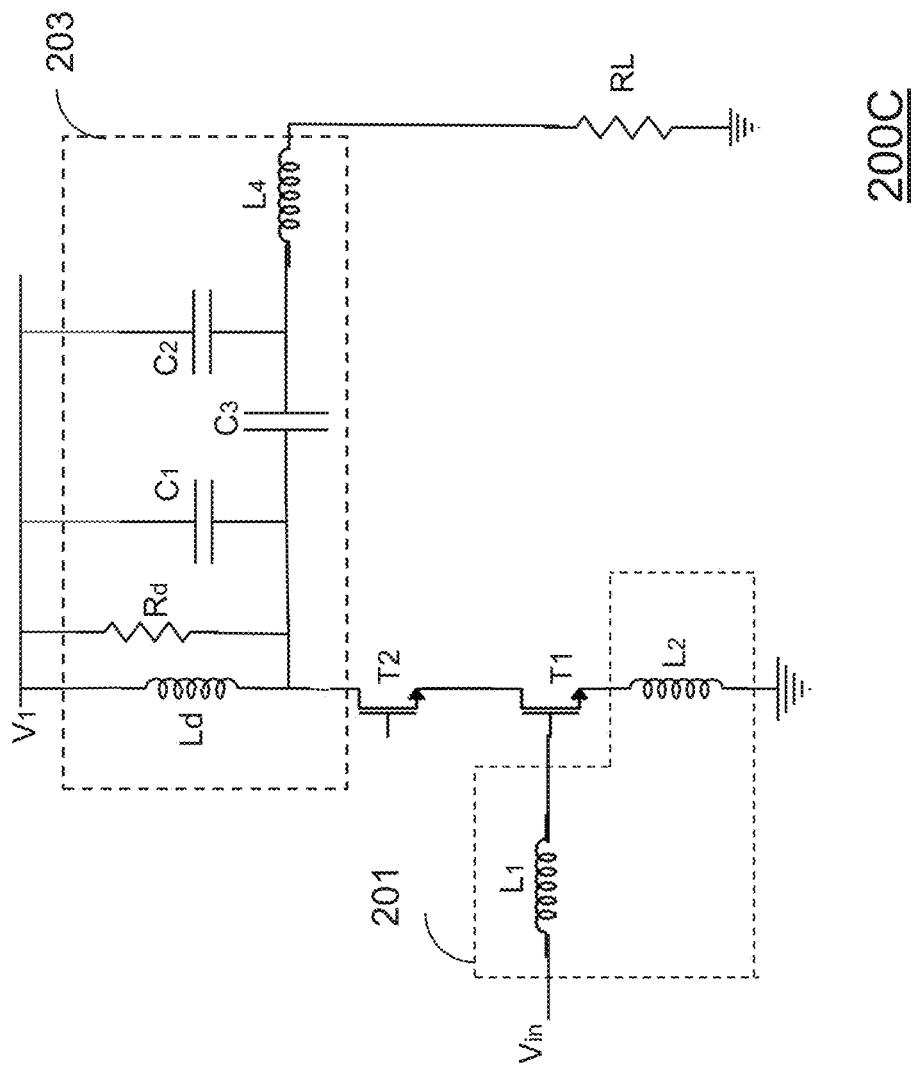
FIG. 2C shows a prior art receiver front-end using multi-stage output matching.
Figure 6A:
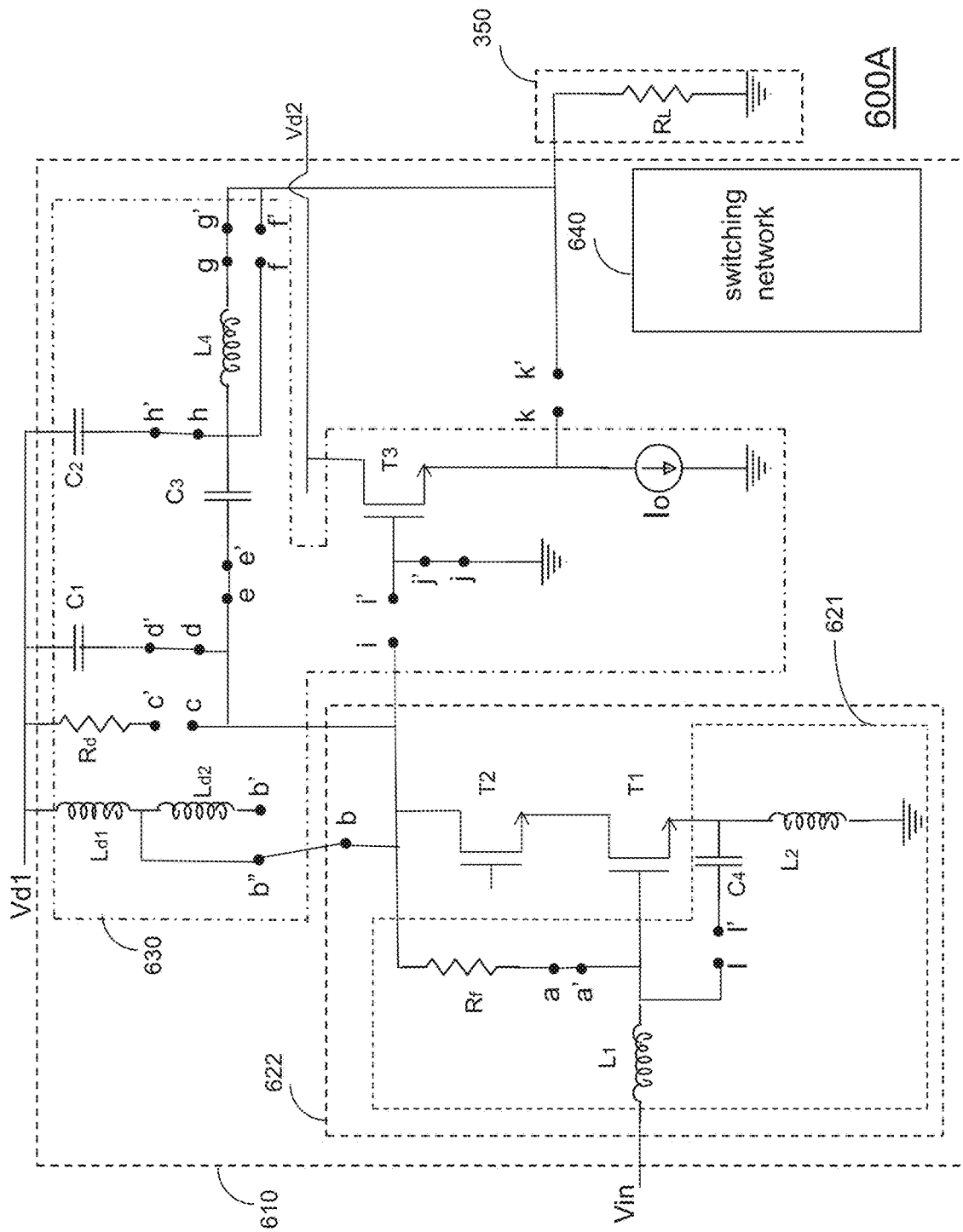

In accordance with further embodiments of the present disclosure, FIG. 6A shows an electronic circuit (600A) comprising an RF receiver front-end (610) which is the RF receiver front-end (410) of FIG. 4A configured according to what is shown in switching configuration table (600B) of FIG. 6B. As shown in switching configuration table (600B), switches (S1, . . . , S12) of switching network (640) are mentioned in a top row with a bottom row showing states of the switches and a middle row showing switch node IDs. In other words, input matching network (621), LNA block (622) and output matching network (630) represent their respective counterparts (421, 422, 430) of FIG. 4A, each configured according to table (600B) of FIG. 6B. In contrast with the RF receiver front-end (510) of FIG. 5A, in RF frond-end (610), the source follower is switched out (nodes i and i' are disconnected) and wideband output matching is achieved using passive elements. In other words, a combination of inductors ($L_{d1}$ or $L_{d1}+L_{d2}$, $L_4$) and capacitors (C1, C2, C3) provides a multi-pole filter which may be designed to accommodate wider bands according to the desired requirements. Moreover, the gate of transistor (T3) is connected to ground for lower power consumption. Referring back to the comparison table of FIG. 2D and the architectures shown in FIGS. 2B-2C, it can be noticed that RF receiver front-end (510) may provide improved gain flatness and linearity over the RF receiver front-end (610) with a possible increase in power depending on the required performance in other parameters with a flexibility to choose how to optimize.

Figure 7A:
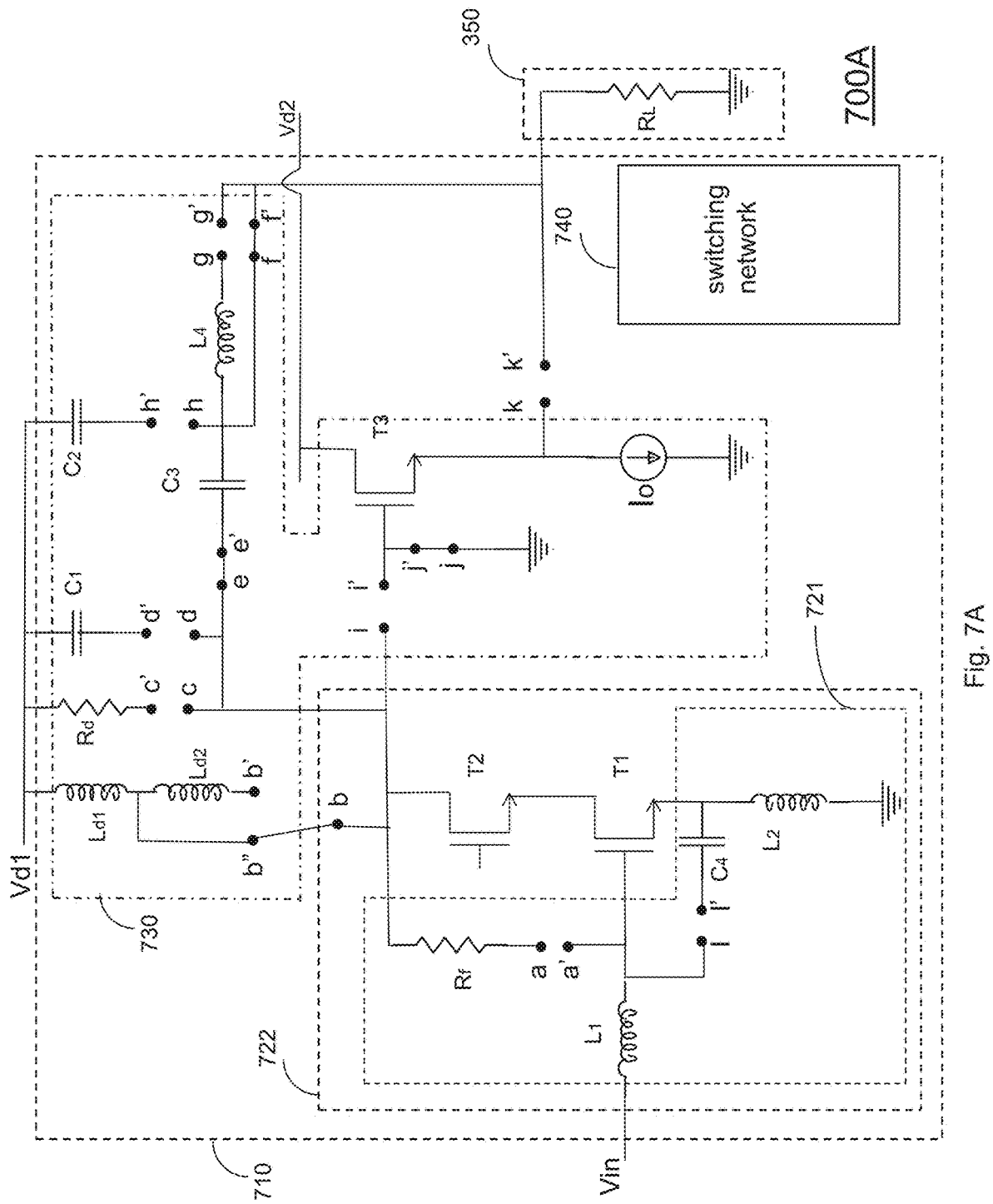

In accordance with other embodiments of the present disclosure, FIG. 7A shows an electronic circuit (700A) comprising an RF receiver front-end (710) which is the RF receiver front-end (410) of FIG. 4A configured according to what is shown in switching configuration table (700B) of FIG. 7B. As shown in switching configuration table (700B), switches (S1, . . . , S12) of switching network (740) are mentioned in a top row with a bottom row showing states of the switches and a middle row showing switch node IDs. In other words, input matching network (721), LNA block (722) and output matching network (730) represent their respective counterparts (421, 422, 430) of FIG. 4A, each configured according to table (700B) of FIG. 7B. In view of what described previously throughout the disclosure, the RF receiver front-end (710) is configured to be used in narrow band application. In such configuration, narrow band output matching is achieved by switching out capacitors (C1, C2), inductor (L4) and transistor (T3). By virtue of using a combination of no $R_d$, and a smaller inductance (e.g. using only ($L_{d1}$ and switching out $L_{d2}$)) with capacitor (C3) narrow band operation is optimized for a desired band. As for the input matching, feedback resistor ($R_f$) is switched out to optimize input matching and NF performance for narrowband operation.

Figure 8A:
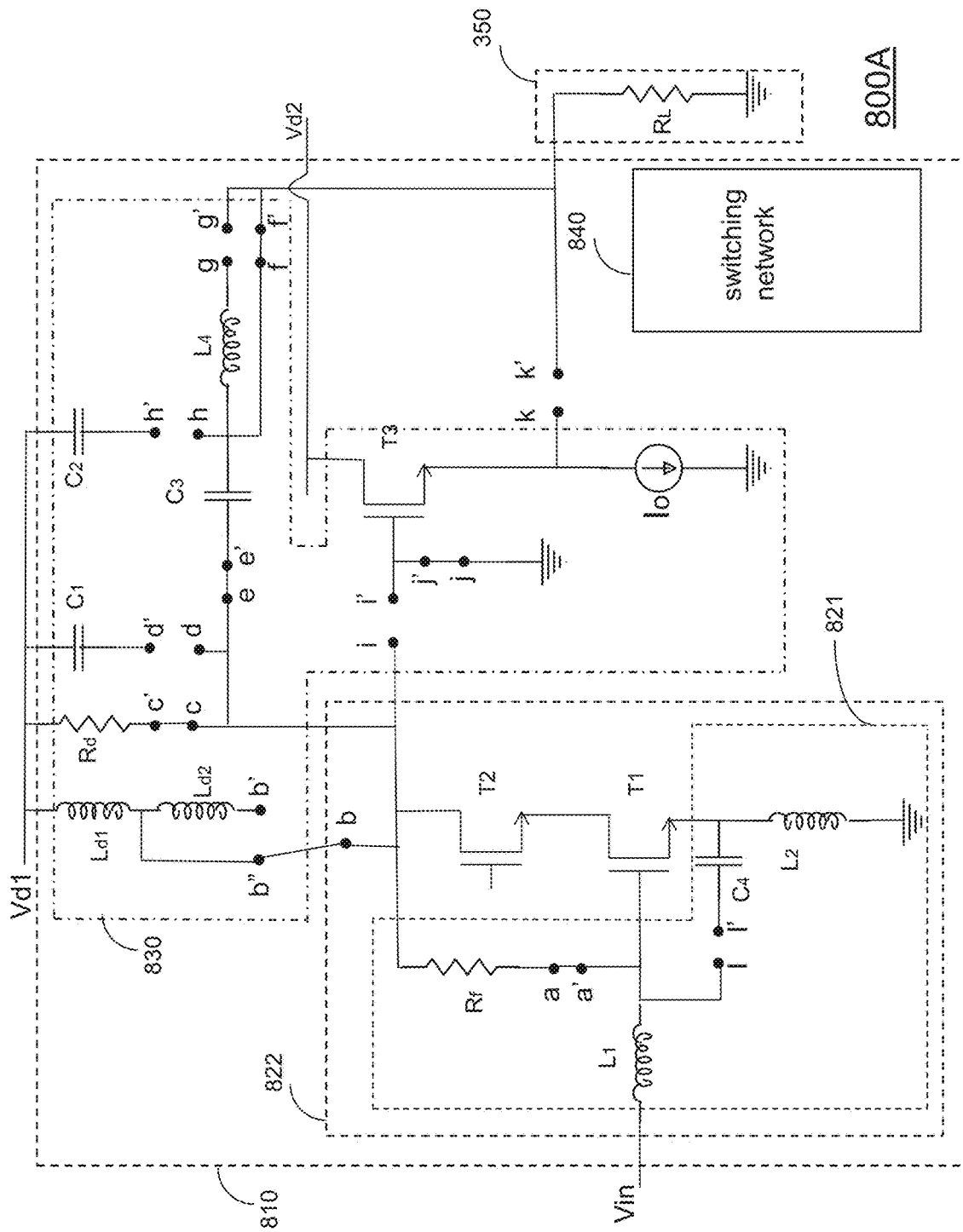

In accordance with yet other embodiments of the present disclosure, FIG. 8A shows an electronic circuit (800A) comprising RF receiver front-end (810) which is the RF receiver front-end (410) of FIG. 4A configured according to what is shown in switching configuration table (800B) of FIG. 8B. As shown in switching configuration table (800B), switches (S1, . . . , S12) of switching network (840) are mentioned in a top row with a bottom row showing states of the switches and a middle row showing switch node IDs. In other words, input matching network (821), LNA block (822) and output matching network (830) represent their respective counterparts (421, 422, 430) of FIG. 4A, each configured according to table (800B) of FIG. 8B. In view of what was described previously throughout the disclosure, the RF receiver front-end (810) is configured to be used in wide band applications but in lower gain mode. In such configuration, wideband output matching is achieved by de-Qing, e.g. switching in resistor (Rd). As discussed previously, this will result in a lower gain. Following the similar mechanism as described before, wideband input matching is obtained by switching the feedback resistor in. With reference to the embodiments shown in FIGS. 4A, 5A, . . . , 8A, one or more passive elements (inductors or capacitors) may be variable to provide further flexibility to meet different requirements.

With further reference to FIGS. 4A-8B, the person skilled in the art will appreciate that, by reconfiguring the same circuit, different requirements imposed by various applications may be met using the teachings of the present disclosure.

Figure 9:
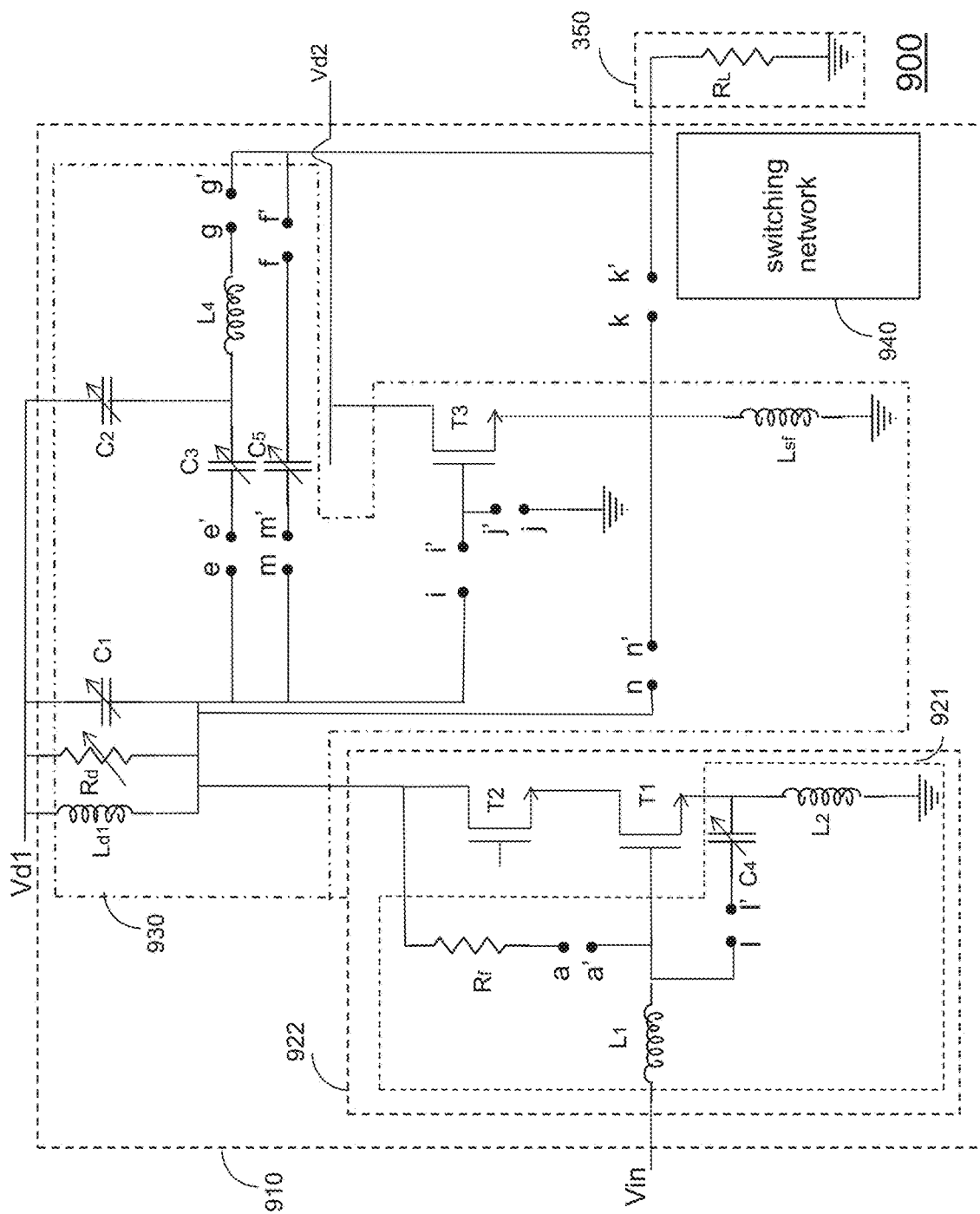

FIG. 9 shows an electronic circuit (900) comprising an RF receiver front-end (910) according to embodiments of the present disclosure. The RF receiver front-end (910) comprises an LNA block (922) including an input matching network (921), and an output matching network (930) that are exemplary implementations of the input matching network (321), the LNA block (322) and an output matching network (330) of FIG. 3. The concepts discussed with regards to embodiments of FIGS. 4A-8A are equally applicable here. In other words, nodes represented with same letters correspond to each other and by connecting or disconnecting corresponding nodes, various elements of the electronic circuit (900) may be switched in or out thereby providing flexibility of adapting to stringent and possibly conflicting requirements imposed by different applications. As shown in FIG. 9, the output matching network (930) comprises variable resistor (Rd) and variable capacitors (C$_1$, . . . C$_5$) to provide additional flexibility when designing such a circuit for different use cases. With reference to FIGS. 4A and 9, it can be noticed that the current source (Io) of FIG. 4A is now replaced by inductance (L$_{sf}$). By way of example, when nodes (n, n') and nodes (k, k') are connected by closing their corresponding switches, inductors (L$_{d1}$, L$_{sf}$) are effectively parallel to each other, resulting in a smaller overall inductance. Such configuration may be used in high performance narrowband application when high quality matching is required to be achieved by using smaller inductances. In such application, single stage LC matching may be achieved by connecting nodes (m, m') and (f, f') to each other by closing corresponding switches. Continuing with the same scenario, the person skilled in the art will appreciate that by virtue of having variable capacitors (C1, C3, C5) selectable, tuning into different bands for high quality output matching is made possible. The person skilled in the art will also understand that, without departing from the scope and spirit of the invention, each passive element may comprise series and/or parallel combination of elements of the same type. As an example, variable capacitor (C1) may comprise a series and/or a parallel combination of capacitors or a combination thereof. Same applies to all inductors and resistors that are constituents of the electronic circuit (900) of FIG. 9. Switching configurations similar to exemplary switching configurations described previously using switching configuration tables (500B, 600B, . . . 800B) may also be applied here for the electronic circuit (900) of FIG. 9.

With reference to FIGS. 4A-9, embodiments in accordance with the present disclosure may be envisaged where:
- The cascode configuration using transistors (T1, T2) may comprise one or more transistors.
- Transistors (T1, T2, T3) may comprise field-effect transistors (FET) or metal-oxide semiconductor field-effect transistors (MOSFETs)
- Constituent switches of the switching network may comprise field-effect transistors (FET) or metal-oxide semiconductor field-effect transistors (MOSFETs)
- The switching network may comprise one or more switches depending on the requirements.
- Constituents of such embodiments may be implemented on the same chip or on separate chips.
- A combination of transistor (T3) and current source (Io) or inductor (L$_{sf}$) may be implemented according to a common source or common gate configuration.

FIG. 10 shows a high-level flowchart representing the re-configurability of RF receiver front-ends receiver designed according to the teachings of the disclosure and as controlled either by external control commands or by internal commands generated in response to internal conditions. As shown, an input signal received, step (1001). Depending on the bandwidth requirement, step (1002), the RF receiver front-end is configured to narrowband or wideband as shown in steps (1003, 1004) respectively. Moreover, states of switches of FIG. 4B for wideband and narrowband operations are also shown in steps (1003, 1004). Depending also on gain requirements, as shown in step (1005), the RF receiver front-end is configured for a low or high gain, as shown in steps (1006, 1007) and then the output signal is generated. This is a flowchart based on exemplary requirements such as frequency ranges and gain modes just illustrating the flexibility of a design using the same hardware that can adapt to various requirements. As detailed previously, the person skilled in the art will understand that the disclosed teachings can also be used to configure RF receiver front-end receivers to adapt to various requirements other than gain or frequency range.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A Radio Frequency (RF) receiver front-end comprising:
    a reconfigurable low noise amplifier (LNA) block having an input matching network, and an LNA block output;
    an output matching network; and
    a switching network;
    wherein:
        a1. the RF receiver front-end is connectable to a load;
        b1. the switching network is connected to the input matching network, the LNA block and the output matching network;
        c1. the RF receiver front-end is configured to receive an input signal at an RF receiver front-end input, route the input signal through the LNA block, and deliver a corresponding output signal at an RF receiver front-end output connected to the load;
        d1. the switching network is configured to configure or reconfigure the RF receiver front-end while maintaining the input signal routed through the LNA block such that performance metrics of the RF receiver front-end meet one or more requirements comprising: one or more frequency ranges at which the RF receiver front-end receiver operates, or one or more receiver gain modes, wherein the one or more frequency ranges comprises at least one of a) a narrowband, b) an extended narrowband and c) a wideband frequency range and the one or more receiver gain modes comprises at least a first gain mode and a second gain mode, and
        e1. the RF receiver front-end is configured to operate in one or more of a first, second third, fourth, fifth and sixth state, wherein:
            a2. in the first state:
                the input matching network is configured to provide a narrowband input matching based on the narrowband frequency range;
                the output matching network is configured to provide a narrowband output matching based on the narrowband frequency range;
                the LNA block and the output matching network are configured to provide a receiver gain corresponding to the first gain mode;
            b2. in the second state:
                the input matching network is configured to provide the narrowband input matching based on the narrowband frequency range;
                the output matching network is configured to provide the narrowband output matching based on the narrowband frequency range;
                the LNA block and the output matching network are configured to provide the receiver gain corresponding to the second gain mode;
            c2. in the third state:
                the input matching network is configured to provide a wideband input matching based on the wideband frequency range;
                the output matching network is configured to provide a wideband output matching based on the wideband frequency range;
                the LNA block and the output matching network are configured to provide the receiver gain corresponding to the first gain mode;
            d2. in the fourth state:
                the input matching network is configured to provide the wideband input matching based on the wideband frequency range;
                the output matching network is configured to provide the wideband output matching based on the wideband frequency range;
                the LNA block and the output matching network are configured to provide the receiver gain corresponding to the second gain mode;
            e2. in the fifth state:
                the input matching network is configured to provide an extended narrowband input matching based on the wideband frequency range;
                the output matching network is configured to provide an extended narrowband output matching based on the wideband frequency range;
                the LNA block and the output matching network are configured to provide the receiver gain corresponding to the first gain mode; and
            f2. in the sixth state:
                the input matching network is configured to provide an extended narrowband input matching based on the wideband frequency range;
                the output matching network is configured to provide an extended narrowband output matching based on the wideband frequency range;
                the LNA block and the output matching network are configured to provide the receiver gain corresponding to the second gain mode.

2. The RF receiver front-end of claim 1, wherein the output matching network comprises one of a) one or more passive elements, b) one or more active elements, or a combination thereof.

3. The RF receiver front-end of claim 2, wherein the LNA block comprises one or more amplifying transistors configured in cascode.

4. The RF receiver front-end of claim 3, wherein the input matching network comprises a feedback network selectively connecting the LNA block output to a gate of a first amplifying transistor of the one or more amplifying transistors, the first amplifying transistor configured to receive the input signal.

5. The RF receiver front-end of claim 4, wherein the feedback network comprises one or more resistors.

6. The RF receiver front-end of claim 5, wherein the input matching network further comprises:
   a first input matching network inductor connected to the gate of the first transistor of the one or more transistors;
   a second input matching inductor connecting a source of the first transistor of the one or more transistors to ground; and
   an input matching capacitor selectively connectable across a gate-source of the first transistor of the one or more transistors.

7. The RF receiver front-end of claim 6, wherein the input matching capacitor is a variable capacitor.

8. The RF receiver front-end of claim 7, wherein the narrowband input matching is performed by a) closing a first switch of the switching network, thereby connecting the LNA block output with the gate of the first amplifying transistor of the one or more amplifying transistors through the feedback network, b) closing a second switch of the switching network, thereby connecting the input matching capacitor across the gate-source of the first transistor of the one or more transistors, or a combination of a) and b).

9. The RF receiver front-end of claim 8, wherein the wideband input matching is performed by opening the first and the second switch of the switching network.

10. The RF receiver front-end of claim 3, wherein the one or more transistors are field-effect-transistors (FETs) or metal-oxide filed-effect-transistors (MOSFETs).

11. The RF receiver front-end of claim 2, wherein the one or more active elements comprise a transistor implemented in a source-follower configuration.

12. The RF receiver front-end of claim 11, wherein a source of the transistor is connected to a current source or to a inductor.

13. The RF receiver front-end of claim 12, wherein a gate of the transistor is selectively connectable to the LNA block output or to ground, and wherein the source of the transistor is selectively connectable to the LNA block output and/or to the RF receiver front-end output.

14. The RF receiver front-end of claim 13, wherein a drain of the transistor is configured to receive a first bias voltage.

15. The RF receiver front-end of claim 14, wherein two or more passive elements of the one or more passive elements are selectively inter-connectable to one another.

16. The RF receiver front-end of claim 15, wherein the one or more passive elements is configured to receive a second bias voltage, and wherein the one or more passive elements is selectively connectable to the RF receiver front-end output.

17. The RF receiver front-end of claim 16, wherein at least one passive element of the one or more passive elements is selectively connectable to the LNA block output.

18. The RF receiver front-end of claim 17, wherein the one or more passive elements comprises a plurality of inductors, a plurality of capacitors and a plurality of resistors.

19. The RF receiver front-end of claim 18, wherein one or more of the plurality of inductors, capacitors, and resistors is variable.

20. The RF receiver front-end of claim 18, wherein the first gain mode and the wideband output matching are achieved by closing a sixth switch of the switching network, thereby connecting a resistor of the plurality of resistors to the LNA block output.

21. The RF receiver front-end of claim 17, wherein the wideband output matching is performed by:
   closing a third switch of the switching network, thereby connecting the gate of the transistor to the LNA block output;
   opening a fourth switch of the switching network, thereby disconnecting the one or more passive element from the RF receiver front-end output; and
   closing a fifth switch, thereby connecting the source of the transistor to the RF receiver front-end output.

22. The RF receiver front-end of claim 17, wherein wideband output matching is performed by closing a subset of switches of the switching network to inter-connect a subset of passive elements of the one or more passive elements.

23. The RF receiver front-end of claim 1 implemented on a single die or chip.

24. A method of amplifying an input signal received at an RF receiver front-end input, comprising:
   providing an input matching network;
   providing an LNA block with an input matching network and an LNA block output;
   providing a switching network;
   providing an output matching network;
   routing the input signal from RF receiver front-end input, through the LNA block, and to an RF receiver front-end output;
   using the switching network to configure or reconfigure the input matching network, the LNA block, the output matching network, while maintaining the input signal routed through the LNA block, and such that the RF receiver front-end meets one or more requirements comprising at least a narrowband frequency range, a wideband frequency range, a first receiver gain mode and a second receiver gain mode;
   in a first state:
      configuring the input matching network to provide a narrowband input matching based on the narrowband frequency range;
      configuring the output matching network to provide a narrowband output matching based on the narrowband frequency range;
      configuring the LNA block and the output matching network to provide a receiver gain substantially equal to the first gain mode;
   in a second state:
      configuring the input matching network to provide a narrowband input matching based on the narrowband frequency range;
      configuring the output matching network to provide a narrowband output matching based on the narrowband frequency range;
      configuring the LNA block and the output matching network to provide a receiver gain substantially equal to the second gain mode;

in a third state:
- configuring the input matching network to provide a wideband input matching based on the wideband frequency range;
- configuring the output matching network to provide a wideband output matching based on the wideband frequency range;
- configuring the LNA block and the output matching network to provide a receiver gain substantially equal to the first gain mode;

in a fourth state:
- configuring the input matching network to provide a wideband input matching based on the wideband frequency range;
- configuring the output matching network to provide a wideband output matching based on the wideband frequency range; and
- configuring the LNA block and the output matching network to provide a receiver gain substantially equal to the second gain mode.

25. The method of claim 24, further comprising connecting a source-follower circuit to the LNA block output, thereby providing a wideband output matching.

26. The method of claim 24, further comprising:
providing a plurality of passive elements; and
configuring the plurality of passive elements to provide wideband output matching.

27. The method of claim 24, further comprising connecting a resistive feedback to the input matching network, thereby providing the narrowband input matching.

* * * * *